United States Patent [19]

Benner et al.

[11] Patent Number: 5,519,216

[45] Date of Patent: May 21, 1996

[54] ELECTRON-OPTICAL IMAGING SYSTEM HAVING CONTROLLABLE ELEMENTS

[75] Inventors: Gerd Benner, Aalen; Josef Frey, Böbingen; Martin Ross-Messemer, Aalen; Eugen Weimer, Essingen, all of Germany

[73] Assignee: Carl-Zeiss-Stiftung, Heidenheim, Germany

[21] Appl. No.: 296,678

[22] Filed: Aug. 26, 1994

[30] Foreign Application Priority Data

Aug. 26, 1993 [DE] Germany .......................... 43 28 649.6

[51] Int. Cl.⁶ .............................. H01J 37/15; H01J 37/26
[52] U.S. Cl. ............................................. 250/311; 250/307
[58] Field of Search ................................... 250/306, 307, 250/310, 311

[56] References Cited

U.S. PATENT DOCUMENTS

| 4,851,674 | 7/1989 | Kobayashi | 250/311 |
| 4,871,912 | 10/1989 | Kokubo et al. | 250/311 |
| 5,013,913 | 5/1991 | Benner | 250/311 |

FOREIGN PATENT DOCUMENTS

| 488214 | 6/1992 | European Pat. Off. . | |
| 2215947 | 9/1989 | United Kingdom . | |

*Primary Examiner*—Bruce C. Anderson
*Attorney, Agent, or Firm*—Walter Ottesen

[57] ABSTRACT

The invention is directed to an electron-optical imaging system such as for an electron microscope. The imaging system has magnetic lenses, current and voltage sources corresponding thereto, a computer, a permanent memory and a touch panel. The electron microscope is manually calibrated when first taken into use by a discrete sequence of different operating conditions. Polynomes of the second degree are adapted to the experimentally calibrated parameter values for the lens currents. The computer polynome coefficients are stored in a permanent memory. Operating states are adjustable via the touch panel on the operating console of the electron microscope. These operating states lie between the calibrated operating states. The lens currents necessary for these operating states are computed in the computer based on the function coefficients stored in the memory and are subsequently emitted to the current sources by the computer. The step width in which the operating states are adjustable is preselectable via the keyboard independently of the position of the calibrated operating conditions.

10 Claims, 4 Drawing Sheets

ELECTRON-OPTICAL IMAGING SYSTEM HAVING CONTROLLABLE ELEMENTS

BACKGROUND OF THE INVENTION

In electron optics, as a rule, groups of several controllable elements, which act on the electron beam, are used to vary the imaging conditions. For example, it is known to use a two-lens or a three-lens imaging system (condenser system) in electron microscopes at the illuminating end so that the object area which can be illuminated is variable when the positions of the electron source and object plane are fixed. Likewise, it is known for a fixed object plane and a fixed projection plane that the imaging scale is variable with the aid of a three-lens imaging system at the imaging end without a rotation of the image occurring when there is a variation in magnification.

The dependence of the imaging characteristics on the applied lens excitation can be very precisely computed for individual electron-optical imaging elements. However, for the combination of several imaging elements, mechanical tolerances and, with magnetic elements, remanences in the iron circuit of these magnetic elements, cause too great a deviation of the actual imaging characteristics (especially with respect to focusing, maintaining focus or image rotation) from the theoretically computed ones. For this reason, electron microscopes obtained in the marketplace up to now are therefore experimentally calibrated when first taken into use. That is, the excitations of the individual elements corresponding to various operating conditions are determined by manual adjustment and thereafter stored. In later use of the electron microscope, the excitation values which correspond to the selected operating condition are then read out of the memory and are applied to the current sources or voltage sources of the imaging elements. The very substantial calibration effort therefore limits the number of selectable operating conditions, i.e. alignment effort. The operation of the electron microscope is then limited to the experimentally calibrated discrete operating conditions.

U.S. Pat. No. 4,871,912 discloses an electron microscope wherein operating conditions are also adjustable which were not previously calibrated. For this purpose, an external computer is provided which is in addition to the internal computer usually provided in the operator console of the electron microscope. If, for example, a magnification value is inputted via the keyboard of the external computer which lies between two calibrated magnification steps, then the parameter values of the imaging system corresponding to the two mutually adjacent calibrated magnification steps are read into the external computer; parameters are calculated which correspond approximately to the inputted magnification by means of linear interpolation between the calibrated parameter values; and, the electron microscope is then driven in correspondence to these parameter values.

The dependency of the focal width on the lens current is nonlinear for magnetic lenses and is, as a rule, different for each lens because of remanences and manufacturing tolerances. For this reason, an adjustment of adequate accuracy of the imaging conditions for intermediate values is not ensured. In practice, defocused images occur in the final image plane. Furthermore, the input of the intermediate values via the external computer takes a great deal of time and is impractical. This input does not permit, for example, varying the magnification continuously or in fine steps preselectable by the operator while at the same time viewing the object image in the projection plane. However, this last-mentioned capability is required when the optimal magnification is to be adjusted for a detail of the object of interest.

An interpolation between calibrated parameter values is also referred to in U.S. Pat. No. 4,851,674 in connection with a correction of astigmatism or deflection in an electron microscope. However, here no specific data are obtained with respect to the interpolation.

SUMMARY OF THE INVENTION

It is an object of the invention to provide an electron-optical imaging system which makes possible a more convenient operation when utilized in an electron microscope. Operating conditions can be set for which the imaging system is not experimentally calibrated.

The electron-optical imaging system of the invention includes a memory, a computer and several controllable elements which act upon an electron beam and these elements have corresponding current or voltage sources. Values are stored in the memory which are determined from experimentally calibrated parameter values of the imaging system for a discrete sequence of different experimentally calibrated operating conditions. The actual operating conditions are adjustable in a preselectable step width. This step width is independent of the calibrated operating conditions.

The imaging system of the invention makes it possible to adjust operating conditions for which no experimental calibration was made. In contrast to the state of the art, however, specific operating conditions must not be inputted via the computer keyboard. The change of the operating conditions is instead possible in a stepwise manner with the step width being adjustable as desired. The advantage is here provided that the operating conditions such as the magnification can be varied successively by the operator while at the same time viewing the image of the object. This advantage is especially provided with the use of such an imaging system in an electron microscope. It is then especially advantageous when the change of the operating conditions is possible directly at the operating console of the electron microscope and especially via up and down switches or buttons. Also, the selection of the step width should be possible directly at the operator console.

The control signals of the current or voltage sources, which correspond to the actual adjusted operating conditions, are computed from the stored values in the computer. In an advantageous embodiment, the stored values are coefficients of approximation functions. The control signals for the current or voltage sources are computed in the computer based on these coefficients and the corresponding approximation function. Depending upon how well the approximation function approximates the actual curve of the current or voltage characteristic of the parameter to be varied, the better the computed control signals match the ideal control signals corresponding to the same operating conditions. The ideal control signals would be obtained from an experimental calibration under these conditions. Suitable approximation functions must be determined only once during calibration of the imaging system, that is, when the imaging system is taken into service. The approximation functions themselves are then later reconstructed with little computer effort based on a few stored coefficients.

The approximation functions are each intended to be continuous over an interval with two mutually adjacent approximation functions each exhibiting intervals of overlapping continuity. Definitive control signals can be computed over a large range of different operating conditions such as different magnifications by means of the continuous approximation functions and the overlap of the continuity intervals.

Polynomes of the second degree have proven to be especially advantageous for the approximation functions. On the one hand, these functions approximate the magnification current characteristic of the magnetic lenses over an interval with adequate accuracy. Magnetic lenses are usually utilized in electron microscopes. On the other hand, a polynome of the second degree fits uniquely to each of three mutually adjacent calibrated parameter values with little computer effort. This polynome passes through these calibrated parameter values. Furthermore, the number of function coefficients to be stored is low. Three coefficients are stored for each calibrated parameter value. With the aid of these coefficients, any desired intermediate values between the experimentally calibrated parameter values can thereafter be computed.

The invention is usable not only for a single imaging system. Instead, the invention is also applicable to several imaging systems coupled to each other, for example, to the imaging system in an electron microscope which is at the condenser end and at the imaging end. In the so-called constant brightness mode, an automatically coupled magnification change of the condenser system is possible when there is a change of the projective magnification so that the brightness of the viewing screen remains constant.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
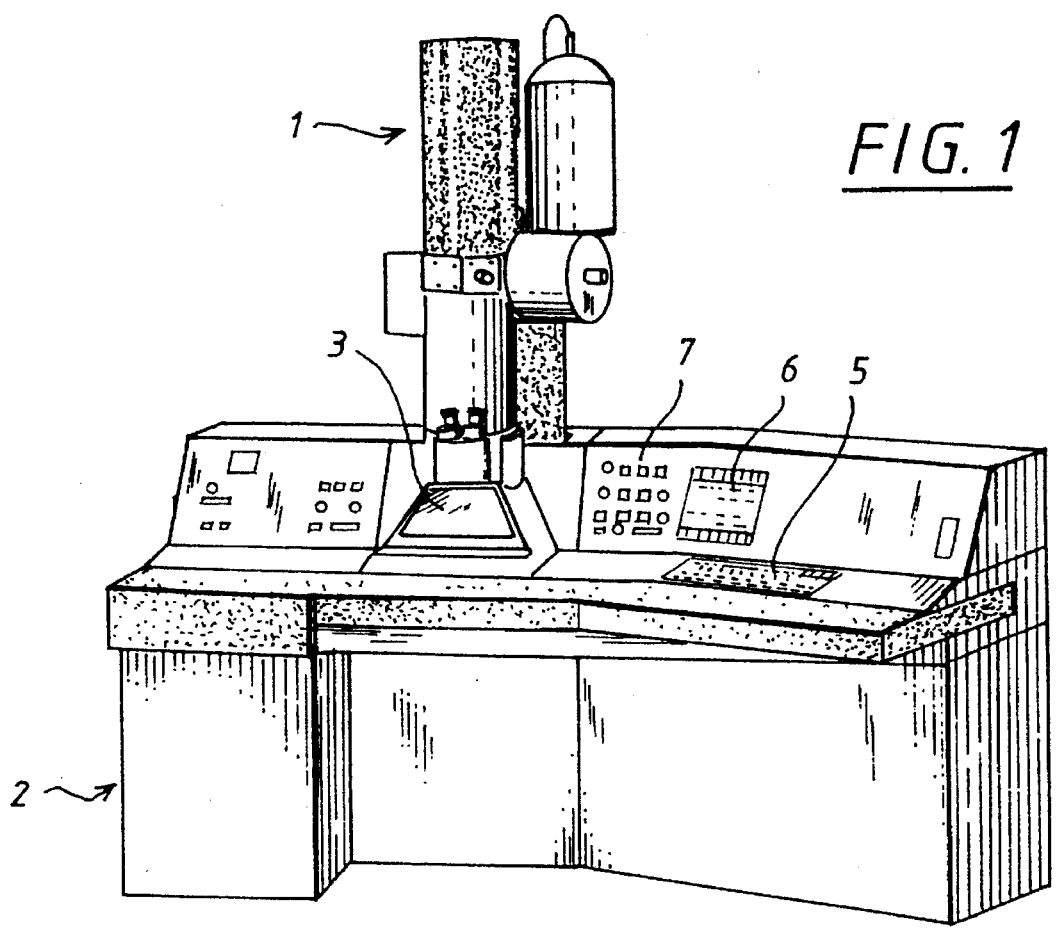
FIG. 1 is a perspective view of an electron microscope incorporating the imaging system according to the invention.

The electron microscope shown in FIG. 1 includes an electron-optical column 1 having the electron-optical components which are here not shown in detail. The electron-optical column 1 and the operating console 2 conjointly define a unit. The projected image of the specimen can be observed on a fluorescent screen (not shown) through a window 3 in the projection chamber of the electron microscope. A commercial computer having a permanent memory such as a hard-disc memory is integrated into the operating console 2. The corresponding keyboard is identified by reference numeral 5 and the monitor by reference numeral 6. Furthermore, the current and voltage sources for the electron-optical elements of the column 1 are contained in the operating console. A touch panel 7 is arranged on the operating console 2 close to the projection chamber so that an observer viewing the projection chamber through the window 3 can simultaneously change the operating conditions of the electron microscope via the touch panel 7. In electron microscopes according to the state of the art, only such operating conditions can be adjusted via a touch panel 7 of the kind referred to above wherein the electron microscope had been previously experimentally calibrated. In contrast, the touch panel 7 of the electron microscope according to the invention permits inputting operating conditions which lie between such experimentally calibrated operating conditions.

Figure 2:
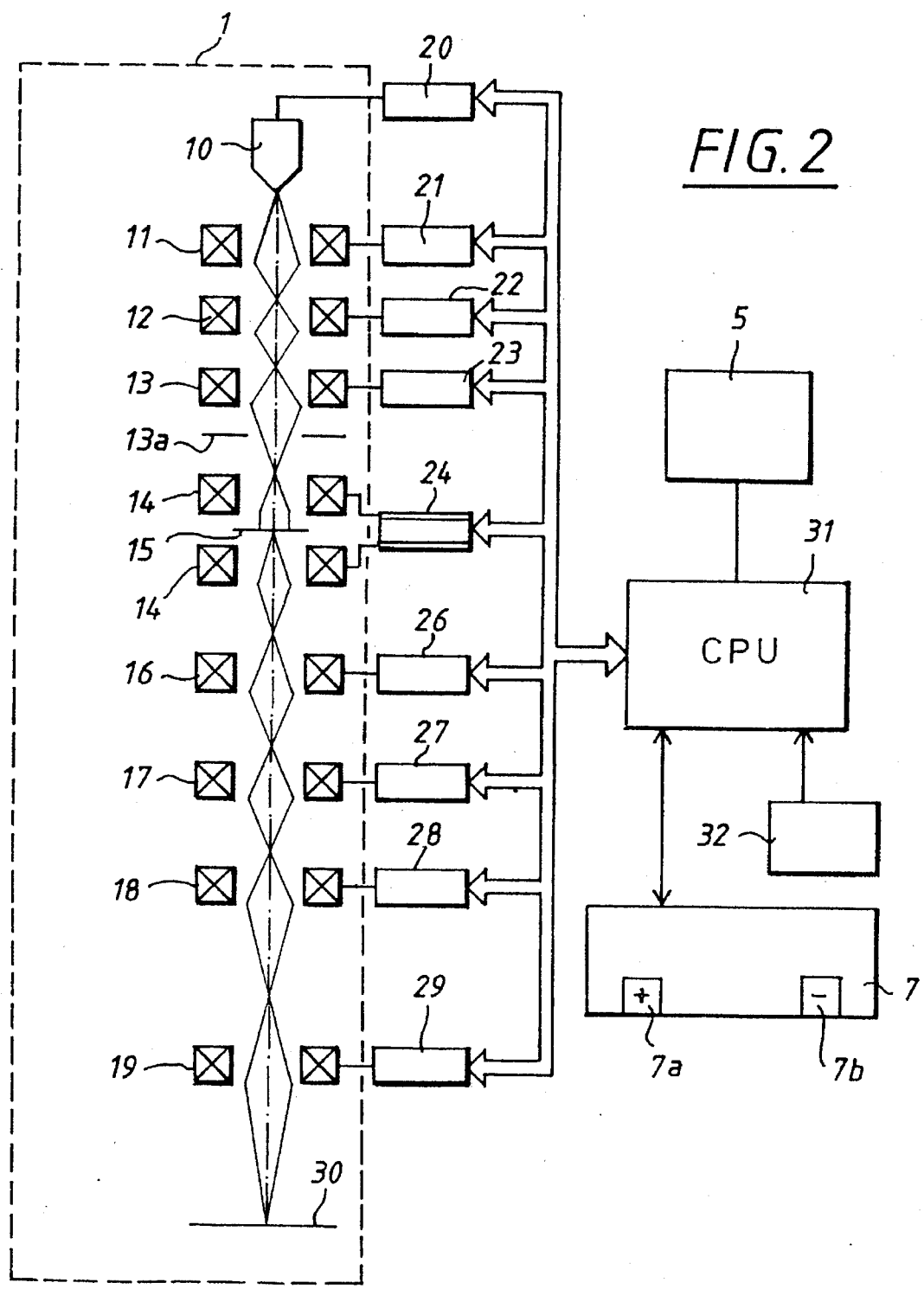
FIG. 2 is a block diagram of the electronic and electron-optical components of the electron microscope of FIG. 1.

As shown in greater detail in FIG. 2, the electron column 1 includes an electron source 10 having a current and voltage source 20 corresponding thereto. The object 15 is mounted in the center of the pole shoe gap of the condenser-objective single-field lens 14. The object 15 is illuminated by the electron beam emanating from the electron source 10. Three additional magnetic condenser lenses (11, 12, 13) are mounted between the electron source 10 and the condenser-objective single-field lens 14. The excitation currents of the condenser lenses (11, 12, 13) can be varied via their current sources (21, 22, 23). By varying the excitation currents, the aperture of the electron beam in the TEM-mode can be varied or the magnitude of the electron probe on the object 15 can be varied in the scanning mode. A condenser diaphragm 13a is mounted between the third condenser lens 13 and the condenser-objective single-field lens 14. The condenser diaphragm 13a can be configured as a multiple diaphragm for adjusting different illuminated areas in the TEM-mode or for adjusting various probe apertures in the scanning mode. The deflection systems required for the diaphragm selection are not shown in FIG. 2. Details of the selection of illuminated areas are disclosed in U.S. Pat. No. 5,013,913 incorporated herein by reference and details as to the selection of the aperture can be obtained from U.S. Pat. No. 5,483,073 which is likewise incorporated herein by reference.

The object 15 is imaged magnified on the fluorescent screen 30 with the aid of the condenser-objective single field lens 14 and four downstream magnification stages configured of magnetic lenses (16, 17, 18, 19) and their corresponding current sources (26, 27, 28, 29). This magnified image of object 15 can be viewed through the window 3 in the projection chamber.

Basically, the excitations of all magnetic lenses (11, 12, 13, 14, 16, 17, 18, 19) are adjustable independently of each other. The excitation parameters of the magnetic lenses are, however, coupled to each other for maintaining the defined illumination and imaging conditions. The control of the current and voltage sources (22 to 29) via a computer 31 having hard-disc memory 32 connected thereto always guarantees maintaining defined illuminating and imaging conditions. The input and change of the operating conditions take place in part via a touch panel 7 connected to the computer and, on the other hand, via a computer keyboard 5.

Figure 3:
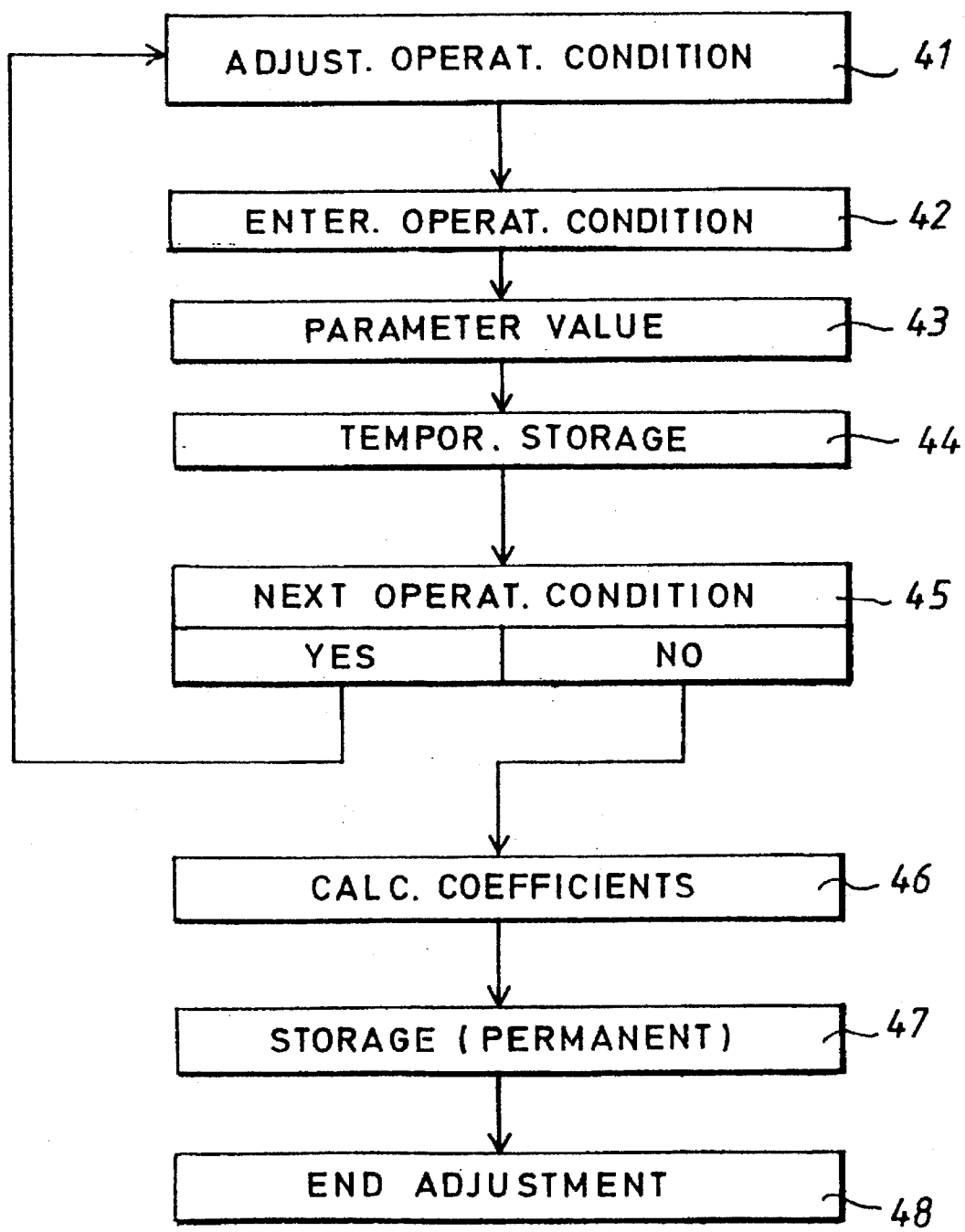
FIG. 3 is a flowchart showing the functional sequence when calibrating the electron microscope of FIGS. 1 and 2.

The first experimental calibration of the electron microscope is made by factory personnel. This calibration takes place in correspondence to the flowchart shown in FIG. 3.

In a first step 41, the lens excitations corresponding to the operating conditions which are to be calibrated are first adjusted in discrete steps via the touch panel 7 in such a manner that the electron beam has the desired beam path within the electron column 1. As soon as the desired beam path is adjusted, the parameters characterizing the adjusted operating state are inputted via the computer keyboard 5 in a second step 42. These parameters include magnification, electron energy, illuminating field diameter, aperture, et cetera. After completing this input, the calibrated parameter values, which were adjusted on the current and voltage sources (20 to 29), are read out to the computer 31 and, in a next step 44, are stored on the hard-disc memory 32 and are assigned to the inputted operating parameters.

In a next step 45, an inquiry is made as to whether a further operating condition is to be experimentally calibrated. In the event that further operating conditions are to be experimentally calibrated, the function steps (41, 42, 43, 44, 45) are run through for each operating condition to be calibrated.

The electron microscope is experimentally calibrated in an adequate number of operating conditions. Thereafter, in function step 45, the inquiry as to whether the manual calibration of an additional operating condition is desired is answered in the negative. The computer 31 then computes, in step 46, the coefficients of the polynome of the second degree which passes through three sets of calibrated parameter values. This computation is made for each calibrated operating condition from the corresponding temporarily stored calibrated parameter values and the corresponding stored calibrated parameter values of the two operating conditions having directly adjacent operating parameters. If In(k) is the current of the nth lens in the kth operating condition and if k−1 and k+1 identify the operating conditions next to k to which the electron microscope is experimentally calibrated, then In(k) is defined by equation (1) as follows:

$$In(k) = a(k+b)^2 + c \qquad (1)$$

By applying equation (1) to the lens currents In(k+1) and In(k−1) of the nth lens corresponding to the neighbored operating conditions k+1 and k−1 and by mutually substituting the three equation systems which result in this manner, the function coefficients a, b, c can be computed pursuant to equations (2), (3) and (4) as shown below:

$$a = \frac{In(k-1) - In(k)}{1 - 2 \cdot (k+b)} \qquad (2)$$

$$b = \frac{-4k \cdot In(k) + (2k-1) \cdot In(k+1) + (2k+1) \cdot In(k-1)}{2 \cdot (2 \cdot In(k) - (In(k-1) + In(k+1)))} \qquad (3)$$

$$c = In(k) - a \cdot (k+b)^2 \qquad (4)$$

The computation of the function coefficients (a, b, c) corresponding to the equations (2), (3), (4) is carried out in function step 46 for each lens of the electron microscope and for each operating condition k for which the electron microscope was experimentally calibrated. If the electron microscope has been calibrated in total in K operating conditions, then 8×K sets of function coefficients a, b and c result for the eight magnetic lenses of the electron microscope which can be adjusted independently of each other. These 8×K sets of function coefficients are stored on the hard-disc memory 32 in the next storage step 47. After storing the function coefficients, the experimental calibration of the electron microscope is ended and the program moves out of the calibration program in step 48.

Figure 4:
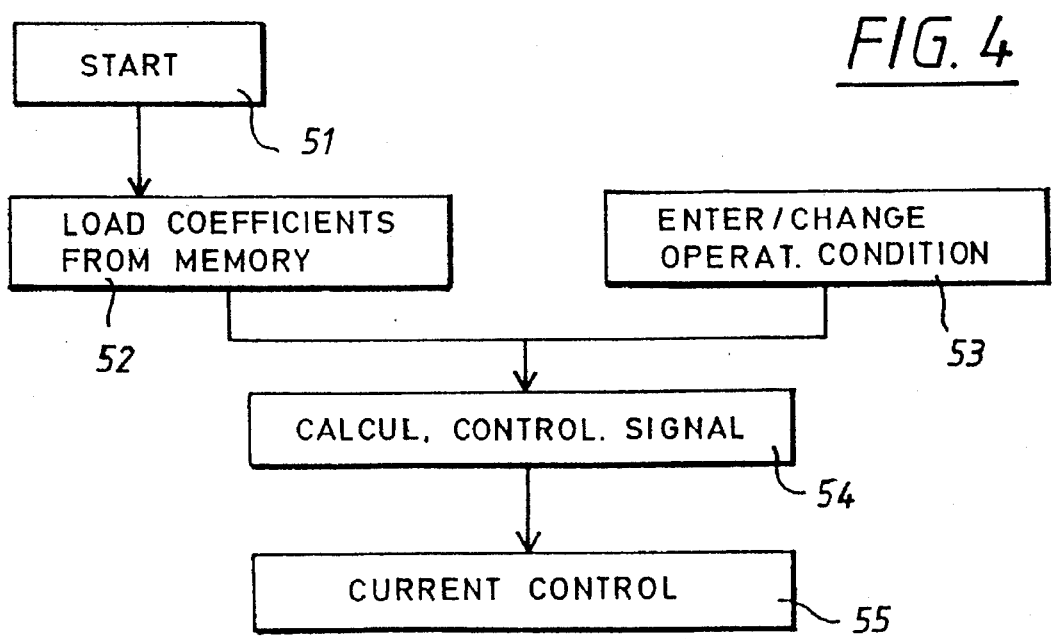
FIG. 4 is a flowchart of the functional sequence when switching on the electron microscope of FIGS. 1 and 2 after an experimental calibration has been completed; and, FIG. 5 is a diagram showing the current characteristic and magnification characteristic of an electron-optical imaging system according to the invention.

When the electron microscope is switched on later (function step 51 shown in FIG. 4), the function coefficients are loaded from the hard-disc memory 32 into the computer 31 in an initialization step 52. The input or change of the operating conditions is performed via the touch panel 7 in step 53. The step width for the finely graduated change can be inputted via keyboard 5. For a freely adjusted step width (δ), the lens current of the nth lens In(k+m·δ) is computed corresponding to equation (5).

$$In(k+m\cdot\delta) = a\cdot((k+m\cdot\delta)+b)^2 + In(k) - a\cdot(k+b)^2 \qquad (5)$$

Here, (m) is an integer positive or negative number and δ<1 is an integer fraction of 1, i.e. 1 divided by an integer. This computation is carried out for all eight lenses of the electron microscope and, thereafter, the lens currents so computed are transmitted to the current sources (21, 22, 23, 24, 25, 26, 27, 28, 29) in step 55. The excitation of all lenses is then changed simultaneously. The function k coefficients relating to operating condition are used for the computation based on equation (5) for all lens currents between In(k−1) and In(k+1) as a central support point of the parameters.

If lens currents result via the up and down buttons (7a, 7b) on the touch panel 7 which are less than In(k−1) or greater than In(k+1), then, in the newly occurring interval, the lens currents are computed on the basis of an equation corresponding to equation (5) in which, however, In(k−1) or In(k+1) is used in lieu of In(k) and the function coefficients corresponding to operating conditions k−1 and k+1 are used in lieu of a, b and c. In this way, overlapping intervals are obtained. A jump of current values at boundary points is thereby avoided. The step width for δ can be selected to be as small as desired because no further experimental calibration is required.

Figure 5:
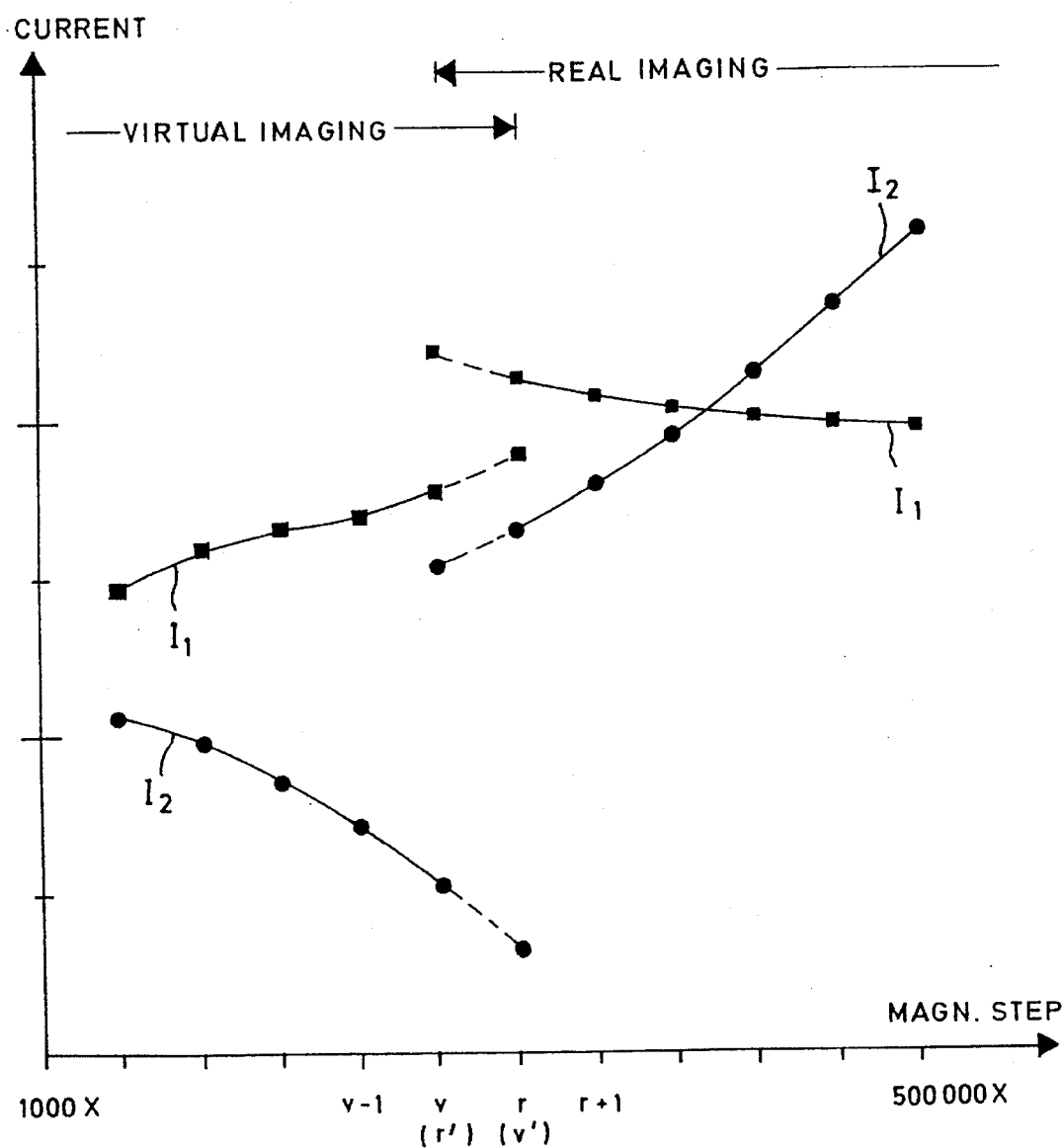

To minimize off-axis image errors (distortion, radial chromatic aberration), projective systems are operated up to approximately average magnification with virtual intermediate imaging and only in the higher magnification range do all lenses generate a real intermediate image. Discontinuities in the lens current curves occur in the transition from virtual to real imaging. In FIG. 5, the lens currents $I_1$ and $I_2$ of two lenses are plotted over a magnification range of 1,000X to 500,000X. The transition from the virtual intermediate image to the real intermediate image takes place at approximately 25,000X magnification. The largest magnification step is identified by (v). At this magnification, the electron microscope is usually still driven at virtual intermediate imaging. The smallest magnification step is identified by r=v+1 at which a real intermediate image is the norm. In order to adjust any desired magnification values between v and r, the electron microscope is additionally calibrated for a virtual intermediate step v' and a real intermediate step r'. The magnification value of the virtual intermediate step v' is equal to the magnification value of the first real step r and the magnification value of the real intermediate step r' is equal to the magnification value of the last virtual step v. The intermediate steps do not serve as central support points; instead, they serve only for computing function coefficients in adjacent support points. The selection, which intermediate step r' or v' forms the basis for magnifications between v and r, is dependent upon from which end (v or r) the magnification is adjusted in the range between v and r. In this way, a discontinuous change of the lens excitation for fine adjustment is also avoided in this intermediate range.

No knowledge of the focal width or the path equations of the electron beam is required for computing the function coefficients and for computing of the lens currents from these function coefficients. The invention is therefore applicable also for parameter values of the lens currents which have been determined strictly empirically. The computation of the intermediate values corresponding to the invention minimizes hysteresis effects of the lenses which can occur especially for large focal length variations.

The invention is not only applicable for an individual imaging system but also for the combination of several imaging systems. Such a combination of two imaging systems is defined in FIG. 2 by the illuminating end condenser lenses (11, 12, 13, 14), on the one hand, and the imaging end lenses (14, 16, 17, 18, 19) on the imaging end. If, for example, the so-called constant brightness mode is adjusted via the touch panel 7 and the imaging end magnification is varied with the aid of the up and down buttons (7a, 7b), then lens current values for the lenses (11, 12 and 13) are computed automatically by the computer 31 based on the loaded function coefficients so that the image brightness on the viewing screen 30 is constant.

To simplify the example, it was assumed for the equations (1) to (5) that the calibrated operating conditions are equidistant and therefore m·δ is always between −1 and 1. This is, however, not required for applying the invention. If, for example, a spacing $x_1$ lies between the calibrated conditions k−1 and k and a spacing $x_2$ lies between the calibrated conditions k and k+1, then the current of the nth lens can be defined in all conditions between k−1 and k+1 by the following equations (1a) and (1b) which are analogous to equation (1):

$$In(k+x_2)=a(k+x_2+b)^2+c \quad (1a)$$

$$In(k-x_1)=a(k-x_1+b)^2+c \quad (1b)$$

Together with the equation (1) for In(k), a system results, in turn, of three equations for the three unknowns a, b and c and from this results an equation analogous to the equation (5) for computing the intermediate states.

The invention is not only applicable for making an adjustment of magnifications lying between calibrated magnifications but also for other variable parameters such as electron current density, image rotation, et cetera.

It is understood that the foregoing description is that of the preferred embodiments of the invention and that various changes and modifications may be made thereto without departing from the spirit and scope of the invention as defined in the appended claims.

What is claimed is:

1. An electron-optical imaging system defining a path for an electron beam, the imaging system having an operating parameter and the system comprising:

a plurality of controllable elements for acting on said electron beam;

a plurality of current or voltage sources connected to corresponding ones of said elements to supply adjustable currents or voltages to said elements thereby establishing operating conditions of said imaging system which define particular values of said operating parameter;

the currents and voltages corresponding to a particular value of said operating parameter being a set of calibrated parameter values determined manually by an operator;

a memory for holding a plurality of said sets of calibrated parameter values corresponding to respective values of said operating parameter with said sets of calibrated parameter values being determined manually by the operator in a discrete sequence of adjustments of said elements;

means for inputting a preselectable step width δ in which said operating parameter is to be changed thereby providing a new operating condition independent of the operating conditions corresponding to said sets of calibrated parameter values;

a computer connected to said memory and to said inputting means; and, said computer including means for computing control signals for driving said current or voltage sources to change said currents and voltages in such a manner that the operating parameter is changed in accordance with said inputted step width δ.

2. The electron-optical imaging system of claim 1, wherein said memory holds calculated values calculated from said calibrated parameter values and wherein said control signals are computed from said calculated values.

3. The electron-optical imaging system of claim 2, wherein said calculated values are coefficients of approximation functions and said control signals are computed based on said coefficients and said approximation functions corresponding thereto.

4. The electron-optical imaging system of claim 3, wherein each of said approximation functions has an interval of continuity and the continuity intervals of mutually adjacent approximation functions being mutually overlapping.

5. The electron-optical imaging system of claim 4, wherein said approximation functions are respective polynomes of the second degree.

6. The electron-optical imaging system of claim 1, wherein said elements are magnetic lenses.

7. An electron microscope for investigating an object, the electron microscope comprising:

electron source means for generating an electron beam;

an electron-optical imaging system defining a path for said electron beam; and, said electron-optical imaging system having an operating parameter and including:

a plurality of controllable elements for acting on said electron beam;

a plurality of current or voltage sources connected to corresponding ones of said elements to supply adjustable currents or voltages to said elements thereby establishing operating conditions of said imaging system which define particular values of said operating parameter;

the currents and voltages corresponding to a particular value of said operating parameter being a set of calibrated parameter values determined manually by an operator;

a memory for holding a plurality of said sets of calibrated parameter values corresponding to respective values of said operating parameter with said sets of calibrated parameter values being determined manually by the operator in a discrete sequence of adjustments of said elements;

means for inputting a preselectable step width δ in which said operating parameter is to be changed thereby providing a new operating condition independent of the operating conditions corresponding to said sets of calibrated parameter values;

a computer connected to said memory and to said inputting means; and, said computer including means for computing control signals for driving said current or voltage sources to change said currents and voltages in such a manner that the operating parameter is changed in accordance with said inputted step width δ.

8. The electron microscope of claim 7, further comprising an operator console having operator-actuated means connected to said computer for driving said elements to adjust said operating conditions.

9. The electron microscope of claim 8, wherein said operator-actuated means comprises a touch panel on said operator console to vary said operating conditions.

10. The electron microscope of claim 7, wherein said electron microscope further comprises:

a fluorescent screen defining a projection plane on which an image of an object is focused;

said object defining an object plane;

a first plurality of said elements defining a first imaging system having a first set of said operating conditions associated therewith and said first imaging system being disposed between said electron source means and said object plane;

a second plurality of said elements defining a second imaging system having a second set of said operating conditions associated therewith and said second imaging system being disposed between said object plane and said projection plane; and, said computer including means for coupling said first and second imaging systems to each other so that a change in said second set of said operating conditions changes said first set of operating conditions to cause the brightness of said image in said projection plane to be constant.

* * * * *

UNITED STATES PATENT AND TRADEMARK OFFICE
CERTIFICATE OF CORRECTION

PATENT NO. : 5,519,216

DATED : May 21, 1996

INVENTOR(S) : Gerd Benner, Josef Frey, Martin Ross-Messemer and Eugen Weimer It is certified that error appears in the above-identified patent and that said Letters Patent is hereby corrected as shown below:

In column 6, line 9: delete "k".

In column 6, line 10: between "condition" and "are" insert -- k --.

Signed and Sealed this

Twenty-fourth Day of September, 1996

Attest:

BRUCE LEHMAN

Attesting Officer     Commissioner of Patents and Trademarks